(12) United States Patent
Fujiwara

(10) Patent No.: US 6,282,163 B1
(45) Date of Patent: Aug. 28, 2001

(54) OPTICAL DISK RECORDING/REPRODUCING DEVICE

(75) Inventor: Tsuneo Fujiwara, Nabari (JP)

(73) Assignee: Sharp Kabushiki Kaishi, Osaka (JP)

(*) Notice: Subject to any disclaimer, the term of this patent is extended or adjusted under 35 U.S.C. 154(b) by 0 days.

(21) Appl. No.: 09/675,234

(22) Filed: Sep. 29, 2000

(30) Foreign Application Priority Data

Oct. 1, 1999 (JP) .................................... 11-281171

(51) Int. Cl.$^7$ ....................................................... G11B 7/00

(52) U.S. Cl. .................. 369/59.2; 369/47.35; 369/59.19; 369/47.38

(58) Field of Search ................... 369/54, 58, 124, 369/59, 47, 44.34, 48, 44.35

(56) References Cited

U.S. PATENT DOCUMENTS

| | | | |
|---|---|---|---|
| 5,745,468 | * | 4/1998 | Nakano .................................. 369/48 |
| 5,761,165 | * | 6/1998 | Takeda et al. ......................... 369/47 |
| 6,081,490 | * | 6/2000 | Kuroda et al. ......................... 369/48 |
| 6,137,756 | * | 10/2000 | Yoshida et al. ........................ 369/48 |

* cited by examiner

*Primary Examiner*—Nabil Hindi
(74) *Attorney, Agent, or Firm*—Dike Bronstein Roberts & Cushman IP Group; George W. Hartnell, III

(57) ABSTRACT

Address information indicative of a certain recording/reproduction position is recorded twice (first address, second address) in an optical disk. Second phase control means makes sampling timings for digitizing the first address have optimal phases. Third phase control means makes sampling timings for digitizing the second address have optimal phases. The second and third phase control means are formed with different circuits, respectively.

22 Claims, 8 Drawing Sheets

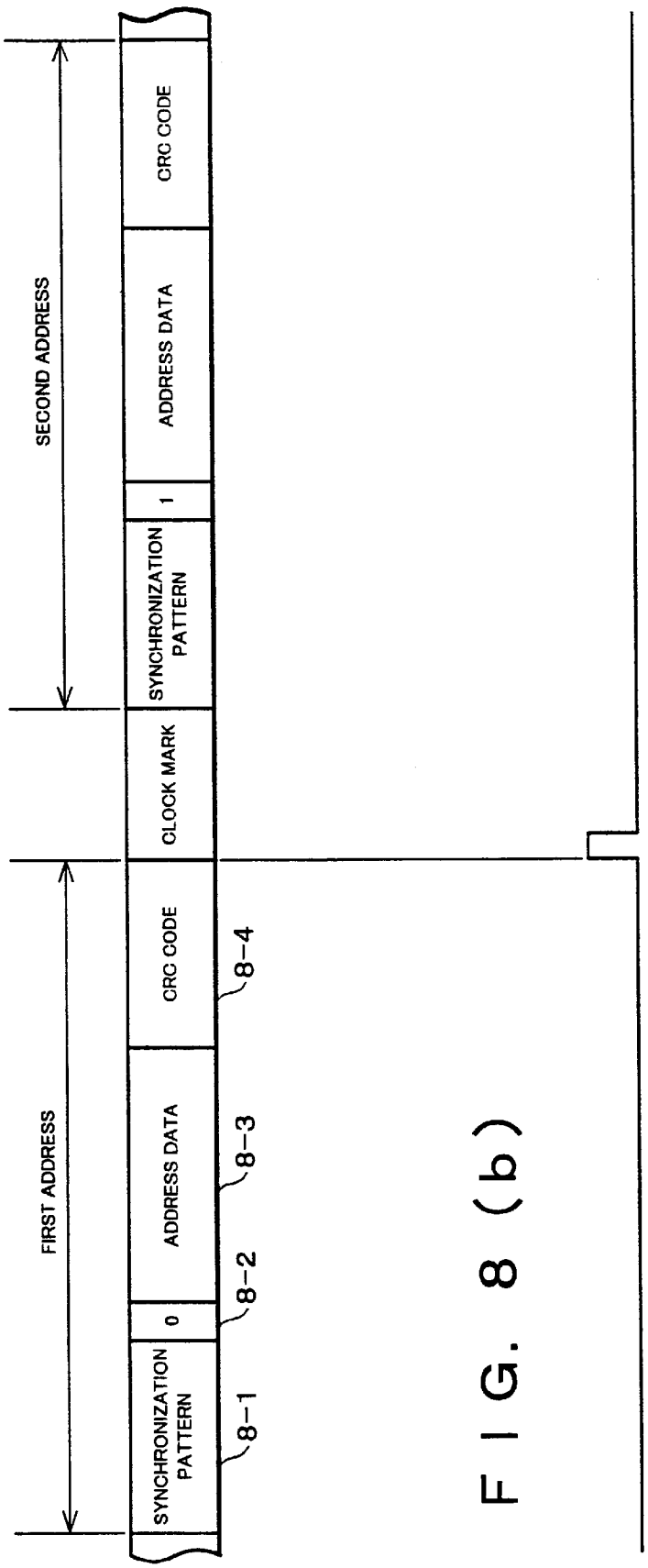

OPTICAL DISK RECORDING/REPRODUCING DEVICE

FIELD OF THE INVENTION

The present invention relates to an optical disk recording/reproducing device capable of accurately reading address information from an optical disk in which address information indicative of a certain recording/reproducing position on the optical disk is repeatedly recorded several times.

BACKGROUND OF THE INVENTION

In an optical disk, address information is preformatted so that an optical disk recording/reproducing device can recognize recording/reproduction-use regions (sectors).

Various methods for preformatting the address information are available and known. Among such methods, a so-called address information multiple-recording method whereby an address information signal indicative of a certain sector is recorded several times is known as a preformatting method with which reproduction and establishment of address information can be improved.

In the case where address information is recorded only once upon random access to an optical disk, if reproduction of the same becomes impossible due to errors occurring to preformatted address information, the finding of a target sector becomes impossible, resulting in that information cannot be recorded/reproduced into/from the foregoing sector.

On the other hand, as described above, multiple recording of address information enables recording/reproduction of information in a sector even if an error occurs to a piece of address information indicative of the sector, since the sector can be recognized as long as another piece of the same address information can be reproduced.

Even with the multiple recording of address information as described above, it often takes place that address information cannot be accurately read by means of a conventional optical disk recording device.

SUMMARY OF THE INVENTION

An object of the present invention is to provide an optical disk recording/reproducing device that is capable of obtaining precise phase information and generating a sampling clock subjected to phase control according to the phase information, with respect to an optical disk in which address information indicative of a certain recording/reproduction position is provided by multiple recording (or by a plurality of address patterns).

To achieve the foregoing object, an optical disk recording/reproducing device of the present invention is an optical disk recording/reproducing device that conducts at least one of recording, reproduction, or deletion of information data with respect to an optical disk in which address information indicative of a certain recording/reproduction position on an optical disk is recorded beforehand a plurality of times on an optical disk, and the device is characterized by comprising phase control means for adjusting phases thereof with respect to every address information, to optimize sampling timings for digitizing the address information thus recorded a plurality of times.

According to the foregoing arrangement, in reproduction of address information indicative of a certain recording/reproduction position in an optical disk in which the address information is provided by multiple recording, phase control is carried out with respect to each piece of the address information independently, in conducting the sampling. Therefore, even if an error occurs to one piece of the address information due to a certain cause, another piece of the address information can be precisely reproduced.

As the optical disk to which the present invention is applicable, an external-clock-type optical disk using clock marks can be used.

According to the present invention, reproduction by using a sampling clock subjected to precise phase control is enabled with respect to the external-clock-type optical disk using clock marks.

In the foregoing arrangement, the phase control means is preferably arranged so as to be provided for each piece of the address information independently, and each of said phase control means executes phase control using a reproduction signal of each piece of the address information.

The foregoing phase control means preferably includes (i) phase difference detecting means for detecting a phase difference between a digitized reproduction signal of the address information and a clock with a frequency equal to a bit cycle of the address information, (ii) leveling means for leveling outputs of said phase difference detecting means, (iii) timing generating means for outputting timings for each piece of the address information, (iv) holding means for holding an output of said leveling means at timings outputted by said timing generating means, and (v) clock phase control means for controlling a phase of a clock indicating sampling timings, according to an output of said holding means.

Furthermore, the foregoing phase difference detecting means preferably further includes (i) a both- edge detecting section for detecting edges of the digitized reproduction signal of each piece of the address information, so as to output an edge pulse, (ii) a rising edge detecting section for detecting rising of the clock, so as to output a rising edge pulse, and (iii) a phase difference holding section for holding a phase difference between the rising edge pulse of the clock and the edge pulse of the digitized reproduction signal of each piece of the address information.

Furthermore, in the foregoing arrangement, the phase difference holding means preferably includes (i) a counter for counting a time difference between a rising edge pulse of the clock and the edge pulse of the digitized reproduction signal of the address information, and (ii) a register for holding a value of said counter.

Furthermore, the foregoing leveling means preferably includes a moving average computing section for computing a moving average of the phase difference detected by said phase difference detecting means between the digitized reproduction signal of the address information and the clock.

Furthermore, the foregoing clock phase control means preferably includes (i) a shift register for generating a group of clocks obtained by delaying the clock by a predetermined unit, and (ii) a clock selector for selecting one clock providing timings closest to optimal sampling timings, from the group of clocks, and for outputting the selected one as a sampling clock.

Furthermore, the timing generating means is preferably arranged so as to include address identifying means for identifying an address information signal and error detecting means for detecting an error of the address information, and to output the timings when the address information signal is identified as a predetermined address information signal by said address identifying means and it is judged by said error detecting means that it includes no error.

Furthermore, the foregoing error detecting means is preferably arranged so as to detect an error detection code that is attached to the address information and is recorded on an optical disk beforehand, and based on a result of the detection, detects an error of the digitized reproduction signal of the address information.

To achieve aforementioned object, an optical disk recording/reproducing device of the present invention an optical disk recording/reproducing device that conducts at least one of the recording, reproduction, or deletion of information data with respect to an optical disk in which address information indicative of a certain recording/reproduction position on an optical disk is recorded beforehand on the optical disk a plurality of times by wobbling a side wall on one side of a recording track, and in which at least one clock mark is recorded with respect to each piece of the address information, and said device is characterized by comprising (1) clock mark detecting means for reproducing a clock mark based on a tangential push-pull signal, (2) address information detecting means for reproducing a plurality of pieces of the address information based on a radial push-pull signal, (3) clock generating means for generating a clock that has a phase conforming to that of the clock mark and that has a frequency equal to a bit cycle of the address information, based on the reproduction signal of the clock mark, and (4) sampling means for generating a sampling clock for each piece of address information based on the digitized reproduction signal of the address information outputted by said address information detecting means and the clock, and for sampling the address information by utilizing the sampling clock, said sampling means being provided with respect to each piece of the address information, and each of said sampling means includes (i) phase difference detecting means for detecting a phase difference between the digitized reproduction signal of the address information and the clock, (ii) leveling means for leveling an output of said phase difference detecting means, (iii) timing generating means for outputting timings for corresponding address information, (iv) holding means for holding an output of said leveling means at timings outputted by said timing generating means, and (v) clock phase control means for controlling a phase of the sampling clock indicative of sampling timings, according to the output of said holding means.

Furthermore, the timing generating means is preferably arranged so as to include address identifying means for identifying an address information signal and error detecting means for detecting an error of the address information, and to output the timings when an address information signal is identified as a predetermined address information signal by said address identifying means and it is judged by said error detecting means that it includes no error.

Furthermore, the error detecting means is preferably arranged so as to detect an error detection code that is attached to the address information and is recorded on an optical disk beforehand, and based on a result of the detection, detect an error of the digitized reproduction signal of the address information.

For a fuller understanding of the nature and advantages of the invention, reference should be made to the ensuing detailed description taken in conjunction with the accompanying drawings.

BRIEF DESCRIPTION OF THE DRAWINGS

FIGS. 8(a) and 8(b) are explanatory views illustrating an example of a format of address information in the optical disk shown in FIG. 6.

DESCRIPTION OF THE PREFERRED EMBODIMENTS

As described above, even with the aforementioned multiple recording of address information, it often takes place that address information cannot be accurately read by means of a conventional optical disk recording device.

Figure 6:
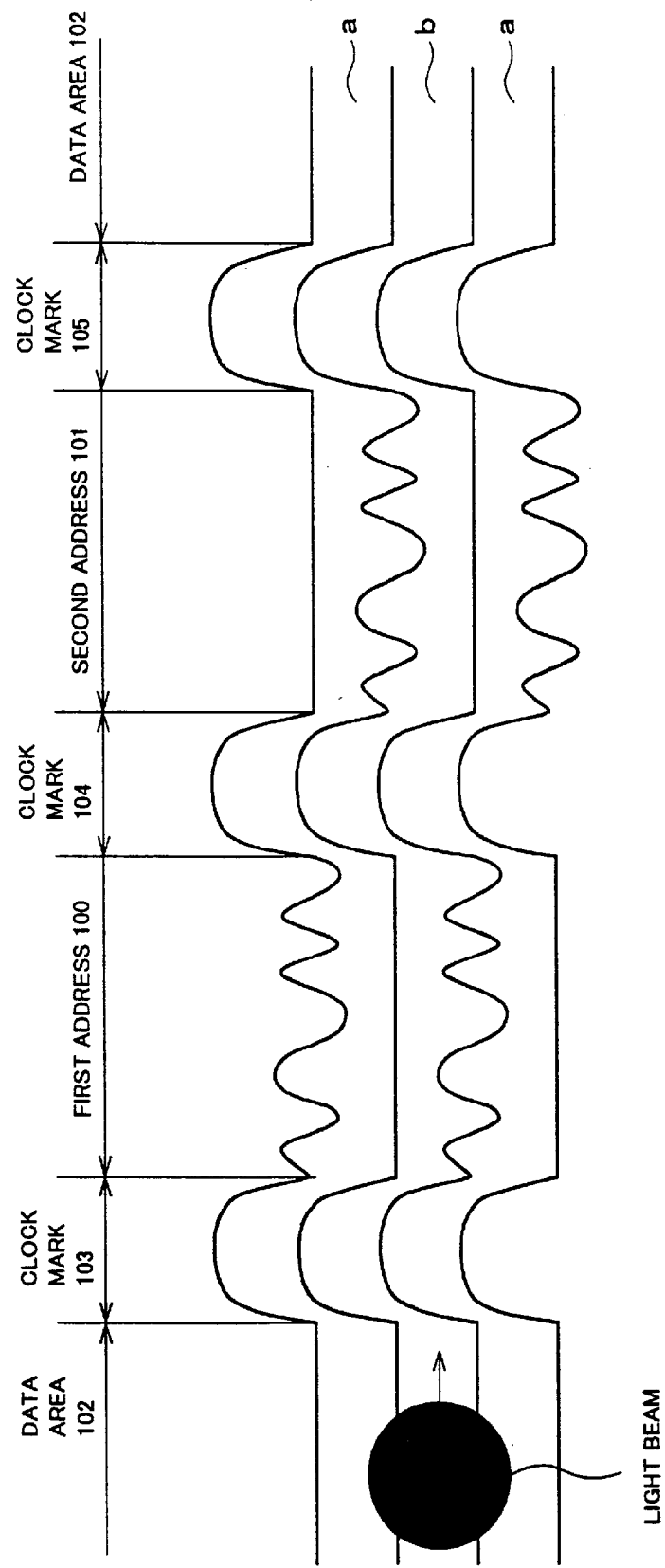
FIG. 6 is an enlarged view illustrating an example of an optical disk to which the present invention is applied.

The following description will explain the foregoing problem, while referring to FIG. 6. FIG. 6 is a view illustrating an example of a format of an optical disk adopting multiple recording of address information. Incidentally, the format shown in FIG. 6 is a format proposed by the applicant of the present application in the Japanese Patent Application No. 121106/1999.

In the optical disk shown in FIG. 6, both grooves a and lands b are used as recording tracks. The optical disk is formatted so that a clock mark 103, a first address 100, a clock mark 104, a second address 101, and a clock mark 105 are provided in the stated order in a space between two data areas 102.

The first address 100 and the second address 101 are preliminarily recorded by wobbling a side wall between the groove a and the land b. The first and second addresses 100 and 101 are recorded by wobbling side walls of a recording track, and the wobbled wall for the first address 100 and the wobbled wall for the second address 101 are on different sides of the track. The clock marks 103, 104, and 105 are recorded by abruptly and greatly wobbling both the sides of the track in one direction, so as to form recesses in the land b and protuberances in the groove a.

Generally, reproduction of address information in the optical disk recording/reproducing device is carried out as follows. Timings in precise phase synchronization with an address signal are generated by a phase-locked loop (PLL) circuit, and the address signal is sampled at the timings and is converted into a digital signal. The optical disk device adapted to an optical disk formatted as shown in FIG. 6 is however an external-clock-type optical disk device that synchronizes the clock with the cycle of the clock marks 103, 104, and 105. In the case of the optical disk device of this type, synchronization patterns of the first and second addresses 100 and 101 have a small number of bits. Therefore, it is difficult to adjust phases according to the address signal at the aforementioned timings.

In order to overcome the above problem, it may be arranged such that: utilizing reproduction signals of the clock marks 103, 104, and 105, a reproduction signal of an entirety of the first address 100, and a reproduction signal of an entirety of the second address 101, a clock whose phase conforms to that of the address signal is generated by the PLL circuit so as to be used as sampling timings. Incidentally, each sampling timing desirably coincides with the center of each bit of the address signal.

Such an optical disk recording/reproducing device however becomes incapable of obtaining precise phase information when an error takes place to one of multiple-recorded pieces of address information due to a defect or the like, that is, incapable of obtaining precise sampling timings, thereby becoming incapable of reading the other piece of the same address information.

Furthermore, in an optical disk as shown in FIG. 6 in which side walls of a track are alternately wobbled so as to preformat the first address 100 and the second address 101, aberration occurs to a spot of a light beam when an optical disk is tilted with respect to an optical pickup, and quality of an address signal provided on one wall on a side remarkably deteriorates. In such a case, the address information cannot be reproduced, and moreover, precise phase information cannot be obtained. Consequently, phase control of sampling timings is disordered, disenabling obtainment of precise sampling timings for reproduction of other address information, thereby causing errors to other address information at a high rate.

Further, a master disk for fabrication of optical disks as shown in FIG. 6 can be fabricated by exposing resist by wobbling two light beams alternately, and by removing the exposed parts by etching. It is however difficult to cause phases of two pieces of address information to accurately coincide with each other, since control systems and routes of the foregoing two beams are delicately different, and hence, the addresses thus recorded by multiple-recording of address information sometimes have phase difference. In such a case, there arises a problem that when the phase of sampling timings is caused to conform to that of one piece of the address information, the phase of sampling timings does not conform to that of the other piece of the same address information. Thus, the advantage of the multiple recording cannot be fully taken.

Considering this, the object of the present invention is to realize an optical disk recording/reproducing device that is capable of generating a sampling clock subjected to phase control with precise phase information, in recording/reproduction with respect to an optical disk in which address information indicative of a certain recording/reproduction position is provided by multiple recording (or by a plurality of address patterns).

The following description will explain an embodiment of the present invention, while referring to the drawings.

The present embodiment will be explained by taking as an example a case where the present invention is applied to an optical disk recording/reproducing device that executes at least one of recording, reproduction, and deletion of information with respect to an optical disk formatted as shown in FIG. 6.

Figure 1:
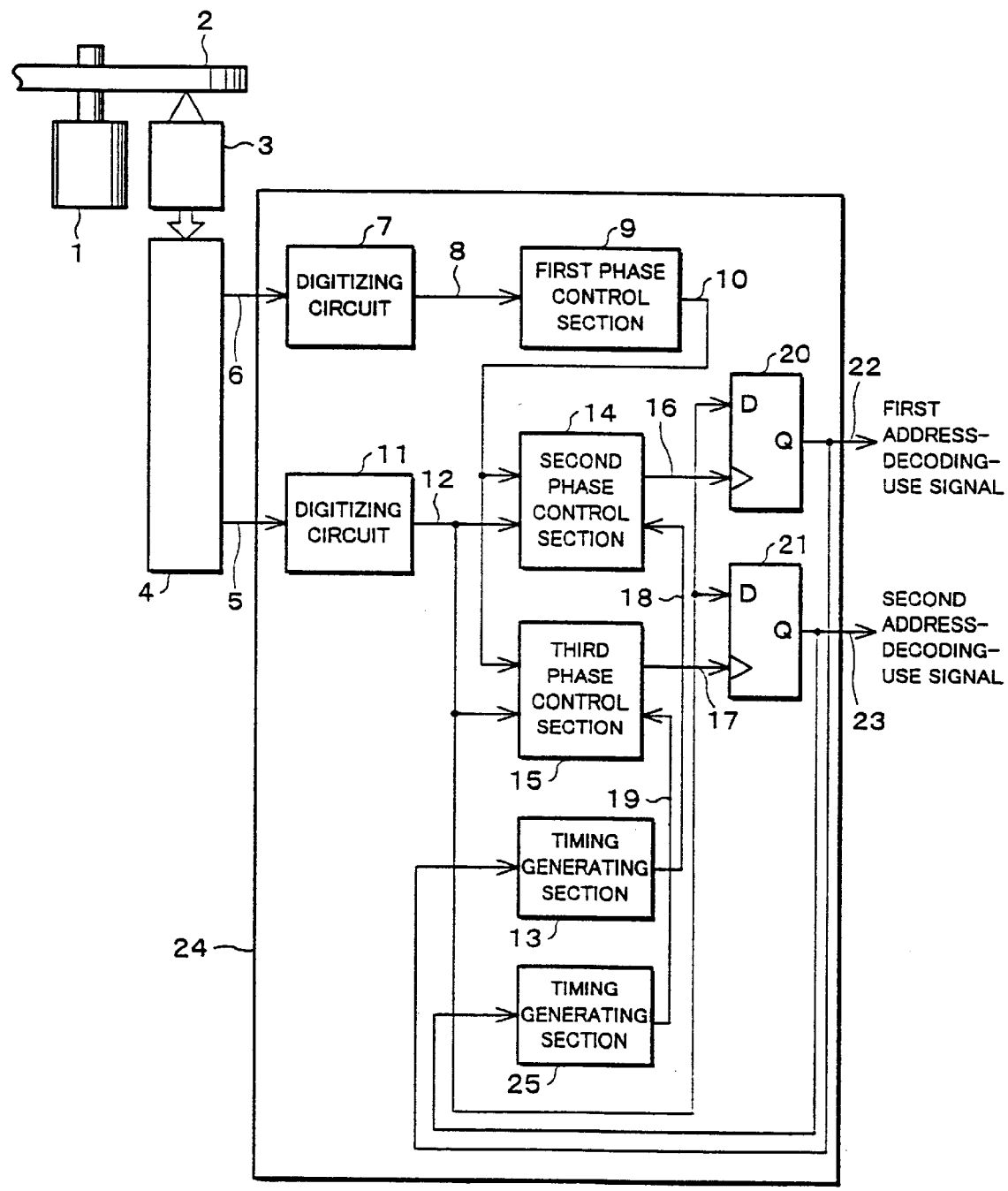
FIG. 1 is a block diagram schematically illustrating an arrangement of an optical disk recording/reproducing device in accordance with an embodiment of the present invention.

FIG. 1 is a schematic block diagram illustrating an arrangement of an optical disk recording/reproducing device in accordance with the present embodiment.

As shown in FIG. 1, an optical disk recording/reproducing device in accordance with the present embodiment includes a spindle motor 1, an optical pickup 3, a signal processing circuit 4, and an address-decoding-use signal generating section 24. The foregoing address-decoding-use signal generating section 24 is composed of a digitizing circuit 7 (clock mark detecting means), a digitizing circuit 11, a first phase control section 9, a second phase control section 14, a third phase control section 15, a timing generating section 13, a timing generating section 25, a flip-flop 20, and a flip-flop 21.

The following description will explain an address information reading operation by the optical disk recording/reproducing device thus arranged.

First of all, a light beam converged by the optical pickup 3 is projected to an optical disk 2 along its guide groove, while the optical disk 2 is being rotated by the spindle motor 1. Light reflected from the optical disk 2 is received by a part of the optical disk inside the optical pickup 3, and based on the output, the signal processing circuit 4 generates a radial push-pull signal 5 as a push-pull signal in a direction of the radius of the disk, as well as a tangential push-pull signal 6 as a push-pull signal in the circumference direction. The address-decoding-use signal generating section 24, supplied with the radial push-pull signal 5 and the tangential push-pull signal 6, generates a first address-decoding-use signal 22 and a second address-decoding-use signal 23. Incidentally, the first address-decoding-use signal 22 and the second address-decoding-use signal 23 are decoded by a decoding circuit (not shown), thereby becoming a first address signal and a second address signal, respectively.

Next, the following description will explain functions of the component elements in an address information reading operation by the foregoing optical disk recording/reproducing device, in the order stated below:

1) the address-decoding-use signal generating section 24;
2) the first phase control section 9 in the address-decoding-use signal generating section 24;
3) the second phase control section 14 and the third phase control section 15 in the address-decoding-use signal generating section 24;
4) the timing generating sections 13 and 25; and
5) the optical pickup 3 and the signal processing circuit 4.

1) The Address-Decoding-Use Signal Generating Section 24

As described above, the address-decoding-use signal generating section 24 is supplied with the radial push-pull signal 5 and the tangential push-pull signal 6 from the signal processing circuit 4 (later described in detail) and generates the first address-decoding-use signal 22 and the second address-decoding-use signal 23. The following description will explain a processing operation in the address-decoding-use signal generating section 24.

First of all, the digitizing circuit 7 (clock mark detecting means) digitizes the tangential push-pull signal 6 supplied thereto with use of a predetermined slice level, so as to generate a clock mark signal 8. Subsequently, the first phase control section 9 (clock generating means, later described in detail) generates a clock 10 that has a phase conforming to that of the foregoing clock mark signal 8 and that has a bit cycle identical to that of an address signal 12 described later.

On the other hand, the digitizing circuit 11 (address information detecting means) digitizes the radial push-pull signal 5 supplied thereto and generates the address signal 12 (a digitized reproduction signal of the address signal). The clock 10 is in phase synchronization with the clock mark signal 8, but its phase does not conform with the phase of the address signal 12 since they are reproduced by different reproducing systems, respectively; they have a certain phase difference therebetween.

Therefore, the first timing generating section 13 and the second timing generating section 25 as timing generating means that will be described later generate timing signals, that is, a first address timing 18 indicative of a region of the first address (hereinafter referred to as first address region) and a second address timing 19 indicative of a region of the second address (hereinafter referred to as second address region), in the first address region and in the second address region, respectively. The second phase control section 14 and the third phase control section 15 (later described in detail) detect a phase difference between the clock 10 and the address signal 12 in the respective regions of the first address and the second address, and delay the clock 10 according to the phase difference, so as to generate the first sampling clock 16 and the second sampling clock 17 having phases suitable for sampling, respectively.

Furthermore, by sampling the address signal 12 by means of the flip-flop 20 supplied with the first sampling clock 16, the address signal 12 is digitized precisely, whereby the first address-decoding-use signal 22 is generated. Furthermore, by sampling the address signal 12 by means of the flip-flop 21 supplied with the second sampling clock 17, the address signal 12 is digitized precisely, whereby the second address-decoding-use signal 23 is generated.

Incidentally, the second phase control section 14, the first timing generating section 13 and the flip-flop 20 compose sampling means, while likewise the third phase control section 15, the second timing generating section 25, and the flip-flop 21 compose sampling means.

Next, the foregoing operation is explained, with reference to the schematic waveform diagrams of FIGS. 2(a) through 2(g).

Figure 2:
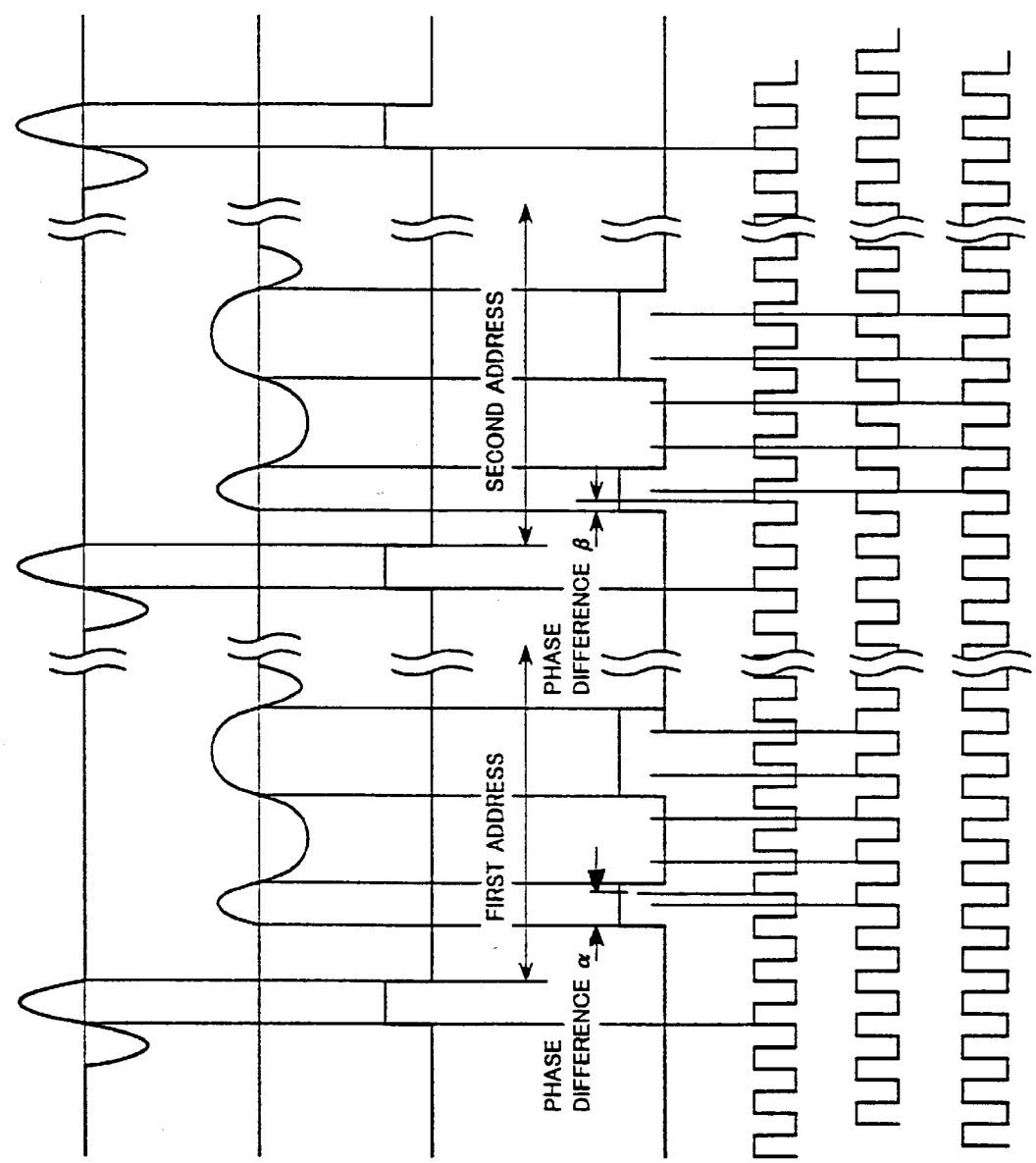
FIGS. 2(a) through 2(g) are waveform diagrams explaining an operation of the optical disk recording/reproducing device of FIG. 1.

FIG. 2(a) is a waveform diagram of the radial push-pull signal 6 supplied from the signal processing circuit 4. FIG. 2(b) is a waveform diagram of the tangential push-pull signal 5 supplied from the signal processing circuit 4. FIG. 2(c) is a waveform diagram of the clock mark signal 8 obtained by digitizing the radial push-pull signal 6 shown in FIG. 2(a) by means of the digitizing circuit 7. FIG. 2(d) is a waveform diagram of the address signal 12 obtained by digitizing the tangential push-pull signal 5 shown in FIG. 2 (b) by means of the digitizing circuit 11.

In the address signal 12 of FIG. 2(d), the signal from the first address region and the signal from the second address region consecutively appear. However, since phases thereof do not coincide, optimal sampling timings for the first address and optimal sampling timings for the second address are different.

FIG. 2(e) is a waveform diagram of a clock 10 generated by the foregoing first phase control section 9, which rises in phase synchronization with the clock mark signal 8 shown in FIG. 2(c).

The second phase control section 14 in FIG. 1 compares edges of the clock 10 and the address signal 12 so as to find a phase difference α therebetween, in the first address region in the address signal shown in FIG. 2(d), and generates and outputs a first address-use sampling clock 16 that rises at a bit center of the first address as shown in FIG. 2(f) based on a result of the foregoing comparison.

The third phase control section 15 compares edges of the clock 10 and the address signal 12 so as to find a phase difference β therebetween, in the second address region in the address signal 12 shown in FIG. 2(d), and generates and outputs a second address-use sampling clock 17 that rises at a bit center of the second address as shown in FIG. 2(g) based on a result of the foregoing comparison.

Consequently, the first address-use sampling clock 16 provides optimal sampling timings with respect to the first address region of the address signal 12. The second address-use sampling clock 17 provides optimal sampling timings with respect to the second address region of the address signal 12. Therefore, even if respective phases of the first and second address regions do not coincide, there does not rise any problem.

Furthermore, for example, even if the signal quality in the first address region in the address signal 12 deteriorates due to scars on the disk surface, a tilt of the light beam to the disk, etc., reproduction of the second address is not adversely affected, since the second phase control section 15 generates the second address-use sampling clock 17 using only the second address region in the address signal 12. Conversely, even if the second address region has low signal quality, it does not adversely affect reproduction of the first address, and hence, the effect of the address multiple recording can be fully achieved.

As explained above, an optical recording/reproducing device of the present embodiment, in reproduction of a first address and a second address, executes phase control with respect to the regions independently, to carry out sampling. Therefore, even if an error occurs to one address due to a certain factor, the other address can be reproduced with precision. Further, this enables reproduction by using a sampling clock whose phase is controlled with precision, with respect to an external-clock-type optical disk using clock marks.

2) The first Phase Control Section 9 of the Address-Decoding-Use Signal Generating Section 24

Figure 5:
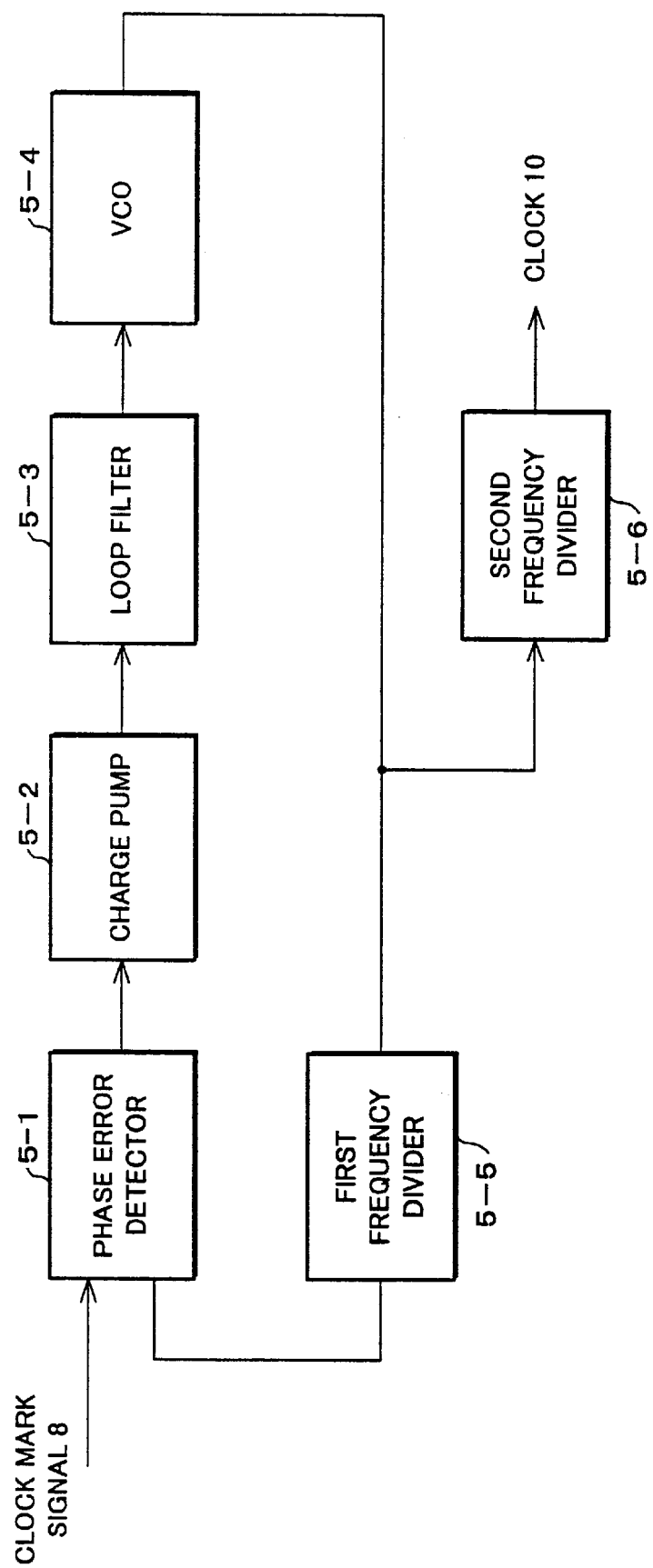
FIG. 5 is a schematic block diagram illustrating an example of an arrangement of a first phase control section shown in FIG. 1.

FIG. 5 is a block diagram schematically illustrating an arrangement of the first phase control section 9. The first phase control section 9 is composed of a phase difference detector 5-1, a charge pump 5-2, a integral loop filter 5-3, a VCO (voltage controlled oscillator) 5-4, a first frequency divider 5-5, and a second frequency divider 5-6.

The phase difference detector 5-1 detects a phase difference of an output of the first frequency divider 5-5 with respect to the clock mark signal 8 inputted thereto, and charges the integral loop filter 5-3 by actuating the charge pump 5-2 according to the detected phase difference. In response to the output of the integral loop filter 5-3, the VCO 5-4 sends a pulse signal according to the foregoing output, to the first frequency divider 5-5. The first frequency divider 5-5 divides the foregoing pulse signal so as to output a signal with the same frequency as that of the clock mark signal 8. This loop control provides control such that the phase of the clock mark signal 8 and the phase of the output of the VCO 5-4 should always coincide with each other.

Furthermore, the output of the VCO 5-4 is also fed to the second frequency divider 5-6. Therefore, by selecting an appropriate frequency division ratio of the second frequency divider 5-6, it is possible to make the output (clock 10) of the second frequency divider 5-6 have the same frequency as that of the bit cycle of the address signal 12 and have the same phase as that of the clock mark signal.

3) The Second and Third Phase Control Sections 14 and 15 of the Address-Decoding-Use Signal Generating Section 24

Figure 3:
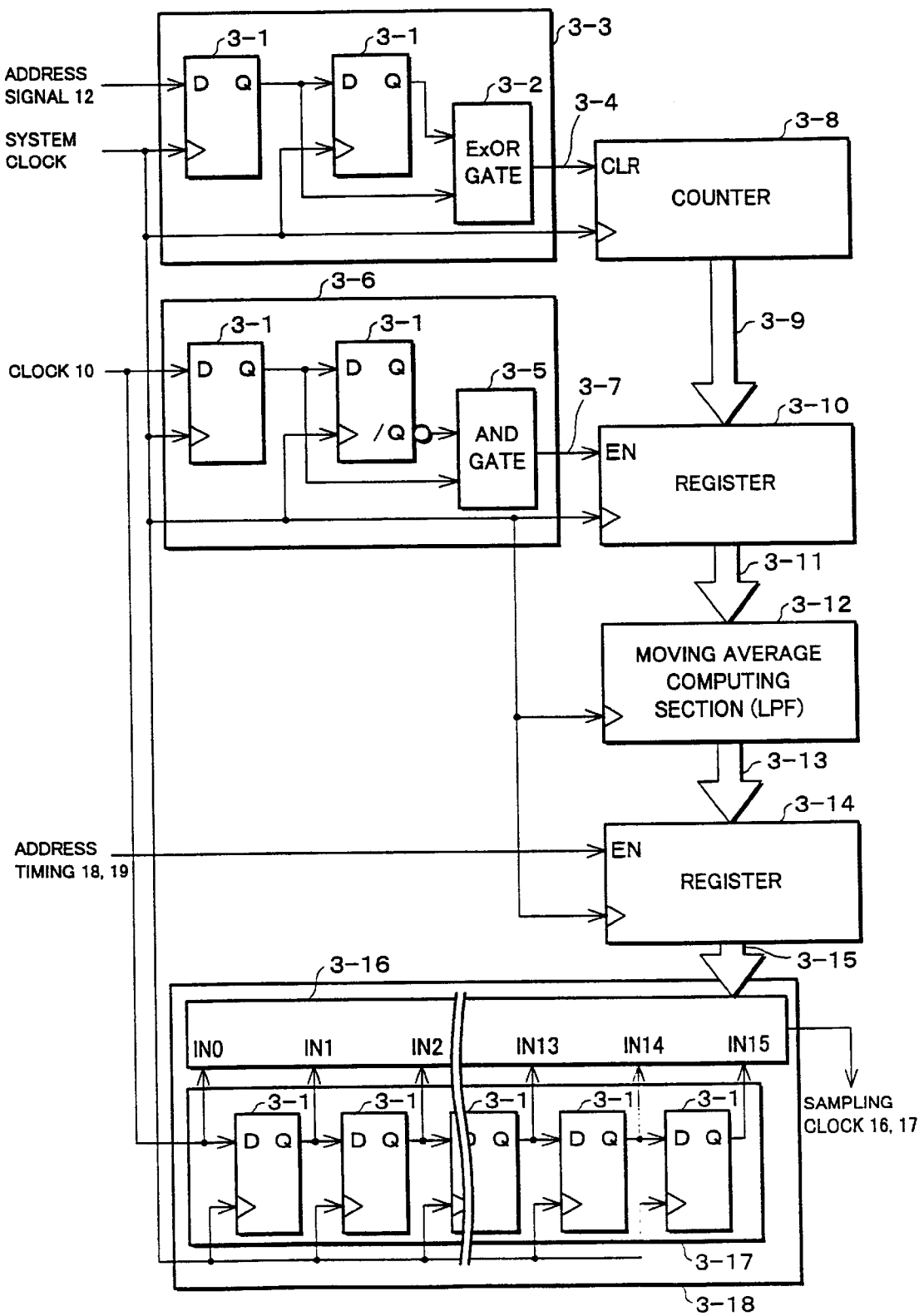
FIG. 3 is a schematic block diagram illustrating an example of an arrangement of a second phase control section and a third phase control section shown in Figure 1.

FIG. 3 is a circuit diagram schematically illustrating a concrete arrangement of the second phase control section 14 and the third phase control section 15.

As shown in FIG. 3, the second phase control section 14 (third phase control section 15) of the present embodiment includes a both-edge detecting section 3-3 that will be described later, a rising edge detecting section 3-6, a counter 3-8, a register 3-10, a moving average computing section 3-12 (leveling means), a register 3-14 (holding means), and a phase control section 3-18 (clock phase control means). Here, the both-edge detecting section 3-3, the rising edge detecting section 3-6, the counter 3-9, and the register 3-10 constitute phase difference detecting means for detecting a phase difference between a digitized reproduction signal of address information (address signal 12) and the clock 10.

The following description will explain an operation of the phase control section of the present embodiment while referring to FIG. 3. Here, however, only the second phase control section 14 is explained, while explanation of the third phase control section 15 is omitted, since their processing operations are identical though the second and third phase control sections 14 and 15 differ in signals inputted thereto (the first address timings 18, and the second address timings 19, respectively) and signal outputted therefrom (the first address-use sampling clock 16, and the second address-use sampling clock 17, respectively).

The second phase control section 14 shown in FIG. 1 is supplied with the clock 10, the address signal 12, the first address timings 18, and a system clock (not shown) having a frequency sufficiently high as compared with the clock 10. An output from the VCO 5-4 (see FIG. 5) not divided, for example, may be used as the system clock.

The both-edge detecting section 3-3 detects when the address signal 12 exhibits different values at successive two clock timings of the system clock, that is, both edges of each pulse of the address signal 12, utilizing two flip-flops 3-1 and an ExOR gate 3-2, and outputs a both edges pulse 3-4.

The rising edge detecting section 3-6 shown in FIG. 3 detects when the clock 10 has a value 0 and a value 1 at subsequent two clock timings of the system clock, that is, detects the rising of the clock 10, utilizing the two flip-flops 3-1 and an AND gate 3-5, and outputs a rising edge pulse 3-7.

The counter 3-8 counts up at timings of the rising of the system clock, and the counter is reset at a timing of the both edges pulse 3-4 of the address signal supplied to a CLR input terminal. The counter 3-8 is designed so that the count is returned when reaching the number of system clocks corresponding to the bit cycle of the address signal. In the present embodiment, the bit cycle of the address signal is set to 16 times the system clock cycle. Therefore, the counter 3-8 is a 4-bit counter, and the count is returned to 0 after having counted from 0 to 15.

The register 3-10 provided behind the counter 3-8 holds a value fed as a data input, when a value fed as an EN (enable) input is at a high level. The register 3-10 is designed so that the rising edge pulse 3-7 of the clock 10 is fed as an EN input to the register, while an output 3-9 of the counter is fed as the data input.

In this arrangement, the counter 3-8 counts the number of system clocks until the timing of the edge pulse 3-4 of the address signal 12, and the count is fed to the register 3-10 at the timing of the rising edge pulse 3-7 of the clock 10. Therefore, a time difference, that is, a phase difference between the rising edge pulse 3-7 of the clock 10 and the edge pulse 3-4 of the address signal is held in the register 3-10 with the system clocks used as units.

In the present embodiment, the bit cycle of the digitized address signal 12 is set to 16 times the system clock cycle. Therefore, assuming that the center of each bit is an optimal sampling timing, an optimal sampling timing is the rising edge pulse 3-7 of the clock 10 when the value of the register is 7 or 8.

Next, an output 3-11 of the register 3-10 is inputted to the moving average computing section (low-pass filter: LPF) 3-12. The moving average computing section 3-12 outputs a moving average of the output 3-11, that is, the phase difference, of the register 3-10. Here, the moving average is an average of the outputs during a certain period, like in the case of a low-pass filter.

The foregoing moving average computing section 3-12 is connected to the register 3-14. The register 3-14 holds an output of the moving average computing section 3-12 when a value fed as the EN input is at a high level. Since the first address timings 18 as the EN input are inputted, the register 3-14 consequently holds an average of the outputs that were obtained during a certain set period before the first address timings 18 are supplied.

The first address timings 18 or the second address timings 19 are generated by a method described later by the timing signal generating section 13 (see FIG. 1). Since the first address timing signal is outputted at a rear part of the first address region, while the second address timing signal 19 is outputted at a rear part of the second address region, the register 3-14 consequently holds an average of phase differences in each address region.

At a stage behind the register 3-14, there are provided the phase control section 3-18 composed of a clock selector 3-16 and a shift register 3-17. Here, the output 3-15 of the register 3-14 is fed to the selector 3-16 as a SEL input thereto, and 16 clocks obtained by shifting the clock 10 by means of the shift register 3-17 are supplied to the clock selector 3-16 as input IN0 through IN15, respectively. Therefore, according to the phase difference supplied to the clock selector 3-16 as the SEL input, the clock selector 3-16 selects a clock providing timings closest to optimal sampling timings, from a group of clocks delayed by one system clock as a unit, referring to Table 1 below, and outputs the selected one as the sampling clock.

TABLE 1

| SEL INPUT | SELECTION OUTPUT |
| --- | --- |
| 0 | IN8 |
| 1 | IN7 |
| 2 | IN6 |
| 3 | IN5 |
| 4 | IN4 |
| 5 | IN3 |
| 6 | IN2 |
| 7 | IN1 |
| 8 | IN0 |
| 9 | IN15 |
| 10 | IN14 |
| 11 | IN13 |
| 12 | IN12 |
| 13 | IN11 |
| 14 | IN10 |
| 15 | IN9 |

Consequently, the output of the clock selector 3-16 comes to have an optimal phase as the sampling clock of the address signal 12.

4) The Timing Generating Sections 13 and 25

In the aforementioned optical disk format shown in FIG. 6, address is not preformatted except in the address regions. Therefore, the address signal 12 becomes a signal resulting from digitizing a noise contained in the radial push-pull signal 5, and the phase information of its edges has nothing to do with the sampling timings of the address signal. Therefore, the first address timings 18 generated by the first timing generating section 13 and the second address timings 19 generated by the second timing generating section 25 must be outputted at respective address regions thereof. In the case of the optical disk format shown in FIG. 6, since address information is recorded at predetermined intervals, it is possible to output a timing signal at the rear part of an address region by counting a system clock, etc. However, generation of timings by the following method enables to more surely output timings only at predetermined address regions.

To precisely output timing signals, a result of detection of an error detection code that is attached to address information and recorded is used here. More specifically, the predetermined address timing signal is outputted when a result of decoding of address information that starts with the synchronization pattern is found to be a predetermined address and absence of errors is found as a result of error detecting operation by using the error detection code. This allows output to be executed at the rear part of the predetermined address region without failure, and prevents an incorrect timing signal from being outputted in a region other than the address region. Furthermore, since the timing signal is outputted only in the case where the decoded result has no error, the timing signal is outputted only in the case where the address signal is not degraded due to scars, etc., and more precise phase difference can be obtained.

Figure 4:
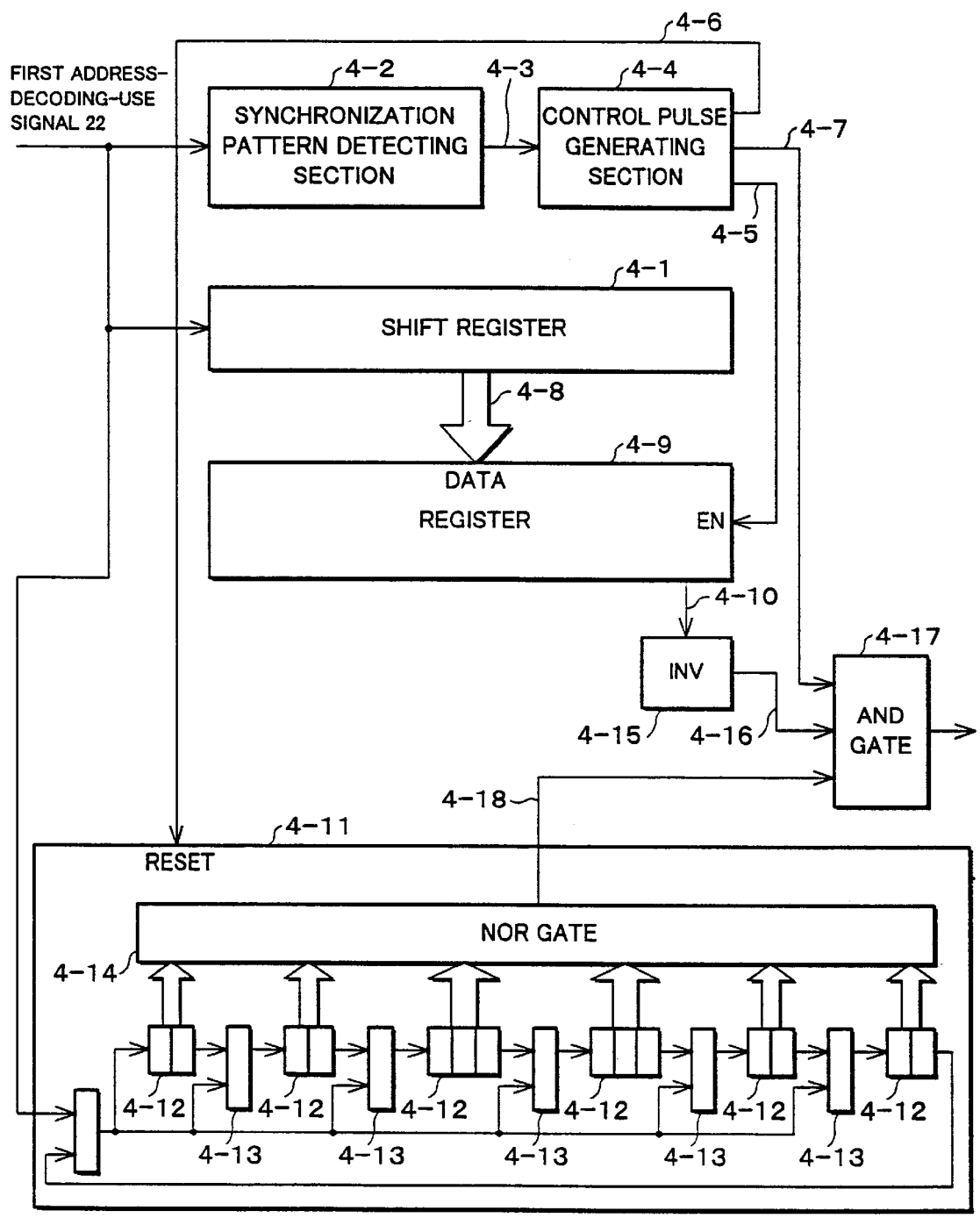
FIG. 4 is a schematic block diagram illustrating an example of an arrangement of a timing generating section shown in FIG. 1.

FIG. 4 is a block diagram illustrating a concrete example of an arrangement of the timing generating sections 13 and 25 adopting the foregoing method. Note that the following description will explain a case where address information is recorded in the format shown in FIG. 8(a). To simplify the explanation, only an arrangement related to the first address timings 18 (i.e., the first timing generating section 13) will be described, and description of an arrangement related to the second address timings 19 (i.e., the second timing generating section 25) will be omitted here since it is similar to that of the first address timings 18.

As shown in FIG. 4, the timing generating section 13 (timing generating section 25) includes a synchronization pattern detecting section 4-2, a control pulse generating section 4-4, a shift register 4-1, a register 4-9, an inverter 4-15, an error detecting section 4-11, and an AND gate 4-17.

The foregoing shift register 4-1, register 4-9, and inverter 4-15 compose address identifying means.

In the first timing generating section 13 arranged as above, the first address-decoding-use signal 22 inputted thereto is supplied first to the shift register 4-1 and the synchronization pattern detecting section 4-2. The synchronization pattern detecting section 4-2 detects a synchronization pattern provided at a head part of address information, and outputs a synchronization pattern detection pulse 4-3. The control pulse generating section 4-4 generates a data load pulse 4-5, an error detection reset pulse 4-6, and an error detection timing pulse 4-7, that follows the synchronization pattern detection pulse 4-3.

An output 4-8 of the shift register 4-1 is fed to the register 4-9 as DATA input thereto, while the data load pulse 4-5 is fed thereto as EN input. The register 4-9 holds the value of the DATA input when the EN input is at a high level. The data load pulse 4-5 is outputted at a timing when the entirety of address data 8-3 following to the synchronization pattern has been completely fed to the shift register 4-1. Therefore, the register 4-9 holds the address data 8-3 following to the synchronization pattern 8-1. Here, the following arrangement is adopted: a head part of the address data 8-3, that is, a bit immediately after the synchronization pattern, is an address identification bit 8-2, and the bit is outputted as address identification signal 4-10; when the address identification bit 8-2 is "0", the address data are identified as the first address; and when the address identification bit 8-2 is "1", the address data are identified as the second address.

The first address-decoding-use signal 22 is supplied to the error detecting section 4-11, which checks whether or not address information contains an error. The present example is explained by taking a case where a CRC (cyclic redundancy check) code derived by the following generating function P(X) is used as an error detection code:

$$P(X)=X^{14}+X^{12}+X^{10}+X^{7}+X^{4}+X^{2}+1$$

In this case, the error detecting section 4-11 is composed of shift registers 4-12, an ExOR gate 4-13, and an NOR gate 4-14 that are connected as shown in the figure. Absence of an error is indicated when the foregoing error detecting section 4-11 is in the following state: after all the shift registers 4-12 are cleared to "0", all data to be subjected to CRC coding, that is, all address data 8-3 and all CRC codes 8-4 corresponding to the address data 8-3, are inputted, and at this point, if all the values of the shift registers 4-12 are "0", that is, an output 4-18 of the NOR gate 4-14 is "1", this means that there is no error.

Therefore, the control pulse generating section 4-4 outputs the error detection reset pulse 4-6 immediately before the data to be subjected to CRC coding are inputted, while the error detection timing pulse 4-7 is outputted when input of all the data to be subjected to the CRC coding and all the corresponding CRC codes is completed.

The output 4-18 of the NOR gate is supplied to the AND gate 4-17 along with the error detection timing pulse 4-7 and a signal 4-16 obtained by inverting the first address identification signal 4-10 by means of the inverter 4-15. Therefore, when the error detection timing pulse 4-7 is outputted, if at the same time all the shift registers 4-12 of the error detecting section 4-11 exhibit a value of "0" (i.e., there is no error) and the address identification bit 4-10 is "0" (i.e., the first address), the AND gate 4-17 outputs the first address timings 18 as shown in FIG. 8(b).

By the first address timing 18 (and the second address timing 19) generating method as described above, the address timings can be obtained only when the address is decoded without errors, and the optimal sampling timings thus obtained can be utilized for subsequent reproduction of addresses. Therefore, it appears that there is a problem in the pull-in process at the starting stage. However, since the frequency of the sampling clock is uniform even if the sampling timings shift, address can be reproduced without errors in many cases. At the point, the sampling timings have the optimal phases, and the optimal sampling timings can be maintained thereafter. Thus, actual operations undergo no problem.

Furthermore, as described above, according to this sampling timing generating method, the timing signal is outputted only in the case where the result of decoding has no error. Therefore, the timing signal is outputted only in the case where the address signal is not degraded by scars, etc., and hence, more precise phase difference can be obtained.

5) The Optical Pickup 3 and the Signal Processing Circuit 4

Figure 7:
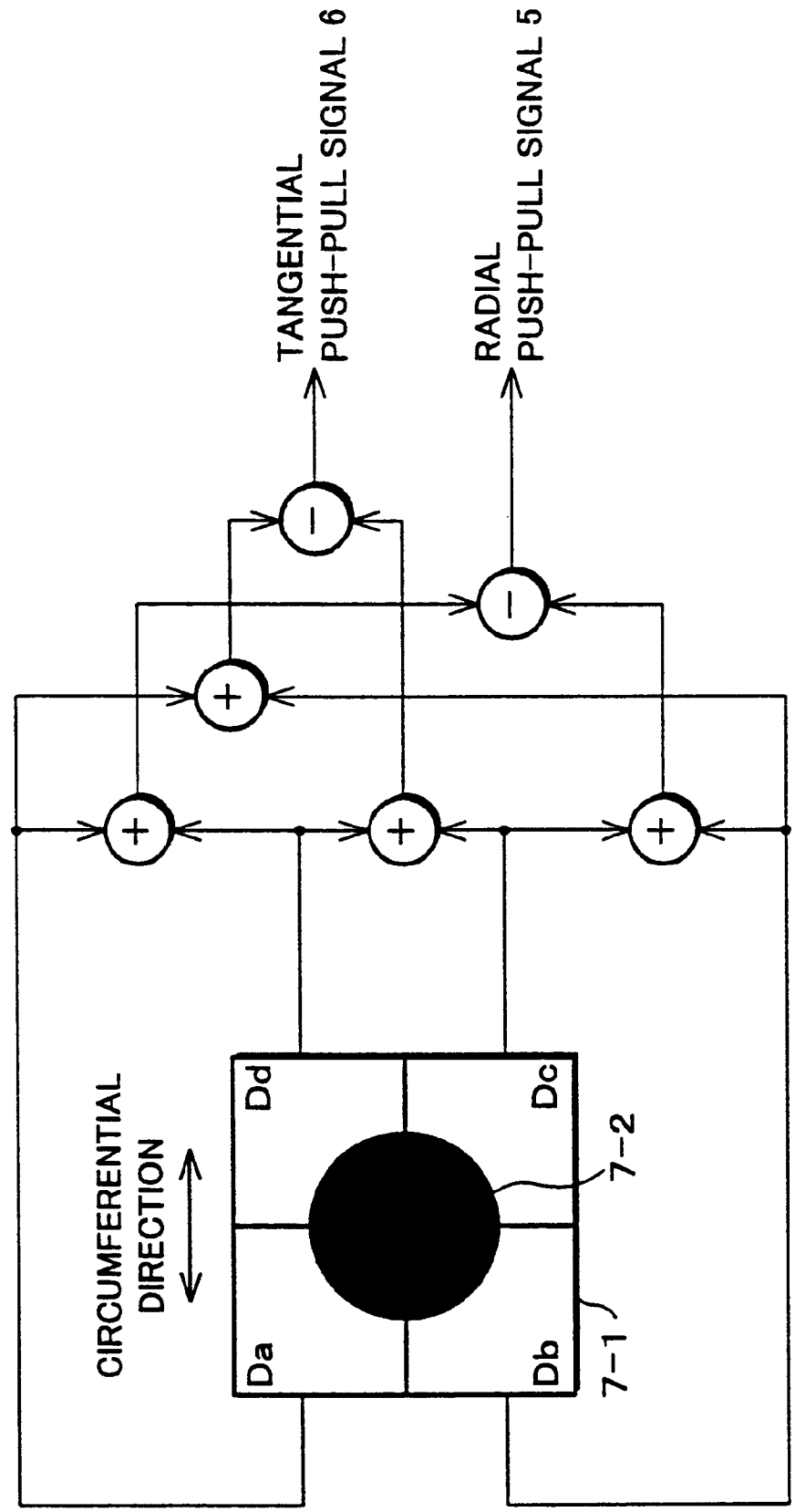
FIG. 7 is a schematic view for explaining an operation of an optical pickup and a signal processing circuit shown in FIG. 1.

The following description will explain examples of the optical pickup 3 and the signal processing circuit 4 that are applicable to the present embodiment, while referring to FIG. 7.

FIG. 7 is an explanatory view illustrating a four-division light detector 7-1 and a circuit for generating the radial push-pull signal 5 and the tangential push-pull signal 6 according to a quantity of light received by the four-division light detector 7-1.

The four-division light detector 7-1 is divided into four regions, and when receiving reflected light 7-2 from the optical disk the foregoing regions provide outputs Da, Db, Dc, and Dd. The signal processing circuit 4 (FIG. 1) calculates a difference of outputs in the circumference direction ((Da+Db)−(Dc+Dd)), so as to obtain the tangential push-pull signal 6. Furthermore, it calculates a difference of outputs in the radial direction ((Da+Dd)−(Db+Dc)), so as to obtain the radial push-pull signal 5.

In the case where a disk formatted as shown in FIG. 6 is reproduced, a reproduction signal of address information can be detected by a radial push-pull signal 5, while a reproduction signal of a clock mark can be detected by a tangential push-pull signal 6.

Incidentally, needless to say, the above-described optical pickup 3 and signal processing circuit 4 are mere examples and the present invention is not limited to this arrangement.

Furthermore, the above-described optical disk recording/reproducing device in accordance with the present embodiment is a mere example preferable, and the present invention is not limited to this arrangement. For example, though in the present embodiment a radial push-pull signal and a tangential push-pull signal are used to reproduce an address signal and a clock mark respectively, other signals such as total signals may be used. Moreover, the format of an optical disk in accordance with the present invention is not limited to the format shown in FIG. 6. Any format is applicable as the format of the optical disk in accordance with the present invention as long as it adopts multiple-recording of address.

Furthermore, the present invention is an optical disk recording/reproducing device that reproduces an optical disk in which address information indicative of one certain recording/reproduction position is recorded in a plurality of regions, but the address information recorded a plurality of times may be information indicative of one and same recording/reproduction position, and pieces of the address information thus recorded are not necessarily completely identical to each other. For example, in the format shown in FIG. 8(*a*), the first address and the second address differ as long as the bit 8-2 is concerned, but it goes without saying that this arrangement is within the scope of the present invention.

As has been described above, a first optical disk recording/reproducing device of the present invention is an optical disk recording/reproducing device that conducts at least one of the recording, reproduction, or deletion of information data with respect to an optical disk in which address information indicative of a certain recording/reproduction position on an optical disk is recorded beforehand on the optical disk a plurality of times, and the device is characterized by comprising phase control means for varying, as to each piece of the address information, sampling timings for digitizing the address information thus recorded a plurality of times, so as to optimally adjust phases thereof.

A second optical disk recording/reproducing device of the present invention is the foregoing first optical disk recording/reproducing device further characterized in that said optical disk is an external-clock-type optical disk using clock marks.

A third optical disk recording/reproducing device of the present invention is the first optical disk recording/reproducing device further characterized in that each piece of the address information is recorded by wobbling a wall on one side of a recording track.

A fourth optical disk recording/reproducing device of the present invention is any one of the foregoing first through third optical disk recording/reproducing devices further characterized in that said phase control means is provided for each piece of the address information independently, and each of said phase control means executes phase control using a reproduction signal of each piece of the address information.

A fifth optical disk recording/reproducing device of the present invention is any one of the foregoing first through fourth optical disk recording/reproducing devices further characterized in that said phase control means includes (i) phase difference detecting means for detecting a phase difference between a digitized reproduction signal of the address information and a clock with a frequency equal to a bit cycle of the address information, (ii) leveling means for leveling outputs of said phase difference detecting means, (iii) timing generating means for outputting a timing for each piece of the address information, (iv) holding means for holding an output of said leveling means at timings outputted by said timing generating means, and (v) clock phase control means for controlling a phase of a clock indicating sampling timings, according to an output of said holding means.

A sixth optical disk recording/reproducing device of the present invention is an optical disk recording/reproducing device that conducts at least one of the recording, reproduction, or deletion of information data with respect to an optical disk in which address information indicative of a certain recording/reproduction position on an optical disk is recorded beforehand on the optical disk a plurality of times by wobbling a side wall on one side of a recording track, and in which at least one clock mark is recorded with respect to each piece of the address information, and the device is characterized by comprising (1) clock mark detecting means for reproducing a clock mark based on a tangential push-pull signal, (2) address information detecting means for reproducing a plurality of pieces of the address information based on a radial push-pull signal, (3) clock generating means for generating a clock that has a phase conforming to that of the clock mark and that has a frequency equal to a bit cycle of the address information, based on the reproduction signal of the clock mark, and (4) sampling means for generating a sampling clock for the address information signal based on the digitized reproduction signal of the address information outputted by said address information detecting means and the clock, and for sampling the address information by utilizing the sampling clock, said sampling means being provided with respect to each piece of the address information, and each of said sampling means includes (i) phase difference detecting means for detecting a phase difference between the digitized reproduction signal of the address information and the clock, (ii) leveling means for leveling an output of said phase difference detecting means, (iii) timing generating means for outputting timings for corresponding address information, (iv) holding means for holding an output of said leveling means at timings outputted by said timing generating means, and (v) clock phase control means for controlling a phase of the sampling clock indicative of sampling timings, according to the output of said holding means.

A seventh optical disk recording/reproducing device of the present invention is the fifth or sixth optical disk recording/reproducing device further characterized in that (i) said timing generating means includes address identifying means for identifying an address information signal and error detecting means for detecting an error of the address information, and (ii) said timing generating means outputs the timings when the address information signal is identified as a predetermined address information signal by said address identifying means and it is judged by said error detecting means that it includes no error.

In the present invention, in reproduction of an optical disk in which address information indicative of a certain recording/reproduction position is provided by multiple recording, a sampling clock is generated by subjecting each address signal to phase control independently. Therefore, even if the phases of the address reproduction signals differ from each other, the decoding is carried out by sampling at optimal sampling timings, whereby each address signal can be precisely decoded.

Furthermore, each set of the sampling timings is generated independently. Therefore, even if any one of address signals of the pieces of the address thus provided by multiple recording has inferior signal quality, it does not adversely affect the generation of sampling timings for another address signal, thereby allowing the advantage of the multiple recording to be fully enjoyed.

Furthermore, this enables reproduction employing a sampling clock whose phase is precisely controlled in an external-clock-type optical disk using clock marks.

Furthermore, timings obtained when absence of error is determined as a result of detection by the error detecting means may be used as address timings indicating timings for leveling phase differences of address signals. By so doing, outputs are made in a rear part of a predetermined address region without failure, and it is possible to prevent a wrong timing signal from being outputted outside the address region. Furthermore, the timing signal is outputted only in the case where the decoded result does not contain errors, and this results in that address timings are generated only in the case where the address signal is not degraded by scars, etc. Consequently, a more precise phase difference can be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical disk recording/reproducing device that performs at least one of recording, reproduction, or deletion of information data with respect to an optical disk whereon plural pieces of address information are recorded beforehand on said optical disk, said plural pieces of address information, respectively, indicative of a same address recording/reproduction position, said device comprising:

phase control means for adjusting a phase for each piece of said plural pieces of address information indicative of the same address as so that respective said plural pieces of address information indicative of the same address can be digitized at respective optimal sampling timings.

2. The optical disk recording/reproducing device as set forth in claim 1, wherein said optical disk is an external-clock-type optical disk using clock marks.

3. The optical disk recording/reproducing device as set forth, in claim 1, wherein each piece of said plural pieces of address information is recorded by wobbling a wall on one side of a recording track.

4. The optical disk recording/reproducing device as set forth in claim 1, wherein said phase control means is provided for each piece of said plural pieces of address information independently, and each of said phase control means executes phase control using a reproduction signal of each piece of said plural pieces of address information.

5. An optical disk recording/reproducing device that conducts at least one of the recording, reproduction, or deletion of information data with respect to an optical disk in which address information indicative of a certain recording/reproduction position on an optical disk is recorded beforehand on the optical disk a plurality of times, said device comprising:

phase control means for, to optimize sampling timings for digitizing the address information thus recorded a plurality of times, adjusting phases thereof with respect to every piece of the address information, wherein said phase control means includes:

phase difference detecting means for detecting a phase difference between a digitized reproduction signal of the address information and a clock with a frequency equal to a bit cycle of the address information;

leveling means for leveling outputs of said phase difference detecting means;

timing generating means for outputting a timing for each piece of the address information;

holding means for holding an output of said leveling means at timings outputted by said timing generating means; and clock phase control means for controlling a phase of a clock indicating sampling timings, according to an output of said holding means.

6. The optical disk recording/reproducing device as set forth in claim 5, wherein said phase difference detecting means further includes:

a both-edge detecting section for detecting edges of the digitized reproduction signal of each piece of the address information, so as to output an edge pulse;

a rising edge detecting section for detecting rising of the clock, so as to output a rising edge pulse; and a phase difference holding section for holding a phase difference between the rising edge pulse of the clock and the edge pulse of the digitized reproduction signal of each piece of the address information.

7. The optical disk recording/reproducing device as set forth in claim 6, wherein said phase difference holding section includes:

a counter for counting a time difference between a rising edge pulse of the clock and the edge pulse of the digitized reproduction signal of the address information; and a register for holding a value of said counter.

8. The optical disk recording/reproducing device as set forth in claim 5, wherein said leveling means includes a moving average computing section for computing a moving average of the phase difference detected by said phase difference detecting means between the digitized reproduction signal of the address information and the clock.

9. The optical disk recording/reproducing device as set forth in claim 5, wherein said holding means is a register.

10. The optical disk recording/reproducing device as set forth in claim 5, wherein said clock phase control means includes:

a shift register for generating a group of clocks obtained by delaying the clock by a predetermined unit; and a clock selector for selecting one clock providing timings closest to optimal sampling timings, from the group of clocks, and for outputting the selected one as a sampling clock.

11. The optical disk recording/reproducing device as set forth in claim 5, wherein:

said timing generating means includes address identifying means for identifying an address information signal and error detecting means for detecting an error of the address information; and said timing generating means outputs the timings when each piece of the address information is identified as a predetermined address information signal by said address identifying means and it is judged by said error detecting means that it includes no error.

12. The optical disk recording/reproducing device as set forth in claim 11, wherein said error detecting means detects an error detection code that is attached to the address information and is recorded on an optical disk beforehand, and based on a result of the detection, detects an error of the digitized reproduction signal of the address information.

13. An optical disk recording/reproducing device that conducts at least one of the recording, reproduction, or deletion of information data with respect to an optical disk in which address information indicative of a certain recording/reproduction position on an optical disk is recorded beforehand on the optical disk a plurality of times by wobbling a side wall on one side of a recording track, and in which at least one clock mark is recorded with respect to each piece of the address information, said device comprising:

clock mark detecting means for reproducing a clock mark based on a tangential push-pull signal;

address information detecting means for reproducing a plurality of pieces of the address information based on a radial push-pull signal;

clock generating means for generating a clock that has a phase conforming to that of the clock mark and that has a frequency equal to a bit cycle of the address information, based on the reproduction signal of the clock mark; and sampling means for generating a sampling clock for the address information signal based on the digitized reproduction signal of the address information outputted by said address information detecting means and the clock, and for sampling the address information by utilizing the sampling clock, said sampling means being provided with respect to each piece of the address information, each of said sampling means includes:

phase difference detecting means for detecting a phase difference between the digitized reproduction signal of the address information and the clock;

leveling means for leveling an output of said phase difference detecting means;

timing generating means for outputting timings for corresponding address information;

holding means for holding an output of said leveling means at timings outputted by said timing generating means; and clock phase control means for controlling a phase of the sampling clock indicative of sampling timings, according to the output of said holding means.

14. The optical disk recording/reproducing device as set forth in claim 13, wherein said clock generating means includes:

a loop control section that, by comparing a phase of a signal generated from a reproduction signal of a clock mark inputted and a phase of a reproduction signal of the clock mark, executes loop control such that the phases should conform to each other at all times; and a frequency dividing section for dividing a signal that has a phase conforming to the phase of the reproduction signal of the clock mark generated by said loop control section, to a frequency equal to a bit cycle of the address information.

15. The optical disk recording/reproducing device as set forth in claim 13, wherein said phase difference detecting means includes:

a both-edge detecting section for detecting edges of the digitized reproduction signal of each piece of the address information, so as to output an edge pulse;

a rising edge detecting section for detecting rising of the clock, so as to output a rising edge pulse; and a phase difference holding section for holding a phase difference between the rising edge pulse of the clock and the edge pulse of the digitized reproduction signal of each piece of the address information.

16. The optical disk recording/reproducing device as set forth in claim 15, wherein said phase difference holding section includes:

a counter for counting a time difference between a rising edge pulse of the clock and the edge pulse of the digitized reproduction signal of the address information; and a register for holding a value of said counter.

17. The optical disk recording/reproducing device as set forth in claim 13, wherein said leveling means includes a moving average computing section for computing a moving average of the phase difference detected by said phase difference detecting means between the digitized reproduction signal of the address information and the clock.

18. The optical disk recording/reproducing device as set forth in claim 13, wherein said holding means is a register.

19. The optical disk recording/reproducing device as set forth in claim 13, wherein said clock phase control means includes:

a shift register for generating a group of clocks obtained by delaying the clock by a predetermined unit; and a clock selector for selecting one clock providing timings closest to optimal sampling timings, from the group of clocks, and for outputting the selected one as a sampling clock.

20. The optical disk recording/reproducing device as set forth in claim 13, wherein:

said timing generating means includes address identifying means for identifying an address information signal and error detecting means for detecting an error of the address information; and said timing generating means outputs the timings when the address information signal is identified as a predetermined address information signal by said address identifying means and it is judged by said error detecting means that it includes no error.

21. The optical disk recording/reproducing device as set forth in claim 20, wherein said error detecting means detects an error detection code that is attached to the address information and is recorded on an optical disk beforehand, and based on a result of the detection, detects an error of the digitized reproduction signal of the address information.

22. An optical disk recording/reproducing device that performs at least one of recording, reproduction, or deletion of information data with respect to an optical disk whereon first address information and second address information are recorded beforehand, said first address information and said second address information, respectively, indicative of a same address recording/reproduction position on said optical disk, said device comprising:

phase control means for adjusting a phase for each said first address information and said second address information so that said first address information and said second address information indicative of the same address recording/reproducing position can be digitized at respective optimal sampling timings.

* * * * *